United States Patent
Lescanne et al.

(10) Patent No.: US 11,302,856 B2
(45) Date of Patent: Apr. 12, 2022

(54) DIPOLE ELEMENT FOR SUPERCONDUCTING CIRCUITS

(71) Applicants: CENTRE NATIONAL DE LA RECHERCHE SCIENTIFIQUE, Paris (FR); ECOLE NATIONALE SUPERIEURE DES MINES DE PARIS, Paris (FR); ASSOCIATION POUR LA RECHERCHE ET LE DEVELOPPEMENT DES METHODES ET PROCESSUS INDUSTRIELS-ARMINES, Paris (FR); ECOLE NORMALE SUPERIEURE, Paris (FR); SORBONNE UNIVERSITE, Paris (FR); UNIVERSITE DE PARIS, Paris (FR)

(72) Inventors: Raphaël Lescanne, Le Kremlin-Bicêtre (FR); Zaki Leghtas, Paris (FR)

(73) Assignees: CENTRE NATIONAL DE LA RECHERCHE SCIENTIFIQUE, Paris (FR); ECOLE NATIONALE SUPERIEURE DES MINES DE PARIS, Paris (FR); ASSOCIATION POUR LA RECHERCHE ET LE DEVELOPPEMENT DES METHODES ET PROCESSUS INDUSTRIELS-ARMINES, Paris (FR); ECOLE NORMALE SUPERIEURE, Paris (FR); SORBONNE UNIVERSITE, Paris (FR); UNIVERSITE DE PARIS, Paris (FR)

( * ) Notice: Subject to any disclaimer, the term of this patent is extended or adjusted under 35 U.S.C. 154(b) by 0 days.

(21) Appl. No.: 16/751,982

(22) Filed: Jan. 24, 2020

(65) Prior Publication Data
US 2021/0234086 A1     Jul. 29, 2021

(51) Int. Cl.
*H01L 39/22*    (2006.01)
*H01L 39/02*    (2006.01)
(Continued)

(52) U.S. Cl.
CPC ........ H01L 39/223 (2013.01); G01R 33/0354 (2013.01); G01R 33/0358 (2013.01);
(Continued)

(58) Field of Classification Search
CPC . H01L 39/223; H01L 39/025; G01R 33/0358; G01R 33/02; G01R 33/0354;
(Continued)

(56) References Cited

U.S. PATENT DOCUMENTS

| | | | | |
|---|---|---|---|---|
| 5,488,295 A | * | 1/1996 | Seppa | G01R 33/0356 324/248 |
| 10,050,630 B2 | * | 8/2018 | Reagor | G06N 10/00 |

OTHER PUBLICATIONS

Sivak et al., "Kerr-Free Three-Wave Mixing in Superconducting Quantum Circuits," Physical Review Applied 11, 2019, pp. 054060-1 to 054060-19.

* cited by examiner

Primary Examiner — Arnold M Kinkead
(74) Attorney, Agent, or Firm — Nixon & Vanderhye

(57) ABSTRACT

The present invention relates to an inductive dipole element for a superconducting microwave quantum circuit. The dipole element comprises a DC-SQUID formed by a pair of Josephson junctions shunted by an inductance, wherein the Josephson junctions have equal energy, and the Josephson junctions and the inductance are arranged such that each of the junctions forms a loop with the inductance. The two loops are asymmetrically threaded with external magnetic DC fluxes $\varphi_{ext1}$ and $\varphi_{ext2}$, respectively, such that $\varphi_{ext1}=\pi$ and $\varphi_{ext2}=0$, wherein parametric pumping is enabled by modulating the total flux $\varphi_\Sigma=\varphi_{ext,1}+\varphi_{ext,2}$ threading the dipole (Continued)

element, thereby allowing even-wave mixing between modes that participate in the dipole element with no Kerr-like interactions.

9 Claims, 2 Drawing Sheets

(51) Int. Cl.
*G01R 33/035* (2006.01)
*H01B 12/02* (2006.01)
*H01F 6/06* (2006.01)
*H03K 19/195* (2006.01)
*H03K 3/38* (2006.01)
*H03K 17/92* (2006.01)
*G06N 10/00* (2019.01)

(52) U.S. Cl.
CPC ............... *H01B 12/02* (2013.01); *H01F 6/06* (2013.01); *H01L 39/025* (2013.01); *H03K 3/38* (2013.01); *H03K 17/92* (2013.01); *H03K 19/1952* (2013.01); *H03K 19/1954* (2013.01); *G06N 10/00* (2019.01)

(58) Field of Classification Search
CPC ...... H03K 19/1954; H03K 17/92; H03K 3/38; H03K 19/1952; H01B 12/02; H01F 6/06; G06N 10/00
USPC ......... 341/133; 324/246, 225, 248; 307/424; 505/874
See application file for complete search history.

DIPOLE ELEMENT FOR SUPERCONDUCTING CIRCUITS

FIELD OF THE INVENTION

The present invention relates generally to a non-linear mixing element for superconducting microwave quantum circuits. More particularly, the present invention relates to a superconducting dipole element for use in a superconducting microwave quantum circuit.

The field of the invention is more particularly, but non-limitatively, that of superconducting circuit based quantum technologies.

BACKGROUND OF THE INVENTION

Electromagnetic radiation waves do not normally interact with each other as they travel in simple media such as vacuum or air. To have two or more waves interact, they should encounter some non-linearity.

For example, in the field of non-linear optics, one uses specific crystals to double the frequency of an incoming radiation via a process called second harmonic generation. This conversion arises from the slightly non-linear potential energy that the electrons experience in the crystal leveraged by the large electromagnetic field of a laser.

In the microwave domain, such interactions are also possible. For example, frequency mixers take two input frequencies and output their sum and difference. To perform this conversion, they rely on carefully designed circuits comprising diodes and transistors that are non-linear electronic components.

In the quantum world, electromagnetic radiations are carried by individual photons. Wave mixing is a process that destroys a number of incoming photons to create several new photons with the constraint that the overall energy must be conserved. For example, in second harmonic generation, the conversion mechanism destroys two photons at frequency $\omega$ and creates one photon at frequency $2\omega$. This conversion involves three photons and hence is qualified as a three-wave mixing process. Also, energy is conserved since the incoming energy is $2(\hbar\omega)$, and the outgoing energy is $\hbar(2\omega)$.

If the desired dynamics do not preserve energy (these interactions being also called non-resonant), the technique of parametric pumping is used. As an example, a conversion between two frequencies $\omega_a$ and $\omega_b$, with $\omega_a<\omega_b$, may be considered, in a process that destroys a photon at frequency $\omega_a$ and creates a photon at frequency $\omega_b$. This is a two-wave mixing process, but it is not resonant. To make this dynamics energy preserving, a three-wave mixing process should be used instead by adding a third electromagnetic tone called a pump with frequency $\omega_p=\omega_b-\omega_a$ that provides the missing energy. These kinds of relations are also called frequency matching conditions. This new process destroys one photon at frequency $\omega_a$ and one photon of the pump to create one photon at frequency $\omega_b$, which overall leads to the desired conversion dynamics. In addition, by increasing the amplitude of the pump tone, the conversion rate is increased.

Superconducting circuits are a great physical platform to manipulate microwave photons and experiment with such mixing dynamics at the quantum level. Superconductivity endows the circuit with very small dissipation resulting in long-lived electromagnetic modes that are used to trap microwave photons and enhance the interactions. The mixing capabilities are provided by a loss-less non-linear element: the Josephson junction. It consists of a thin insulating layer separating two superconducting leads.

In the same manner as in conventional electrical circuits, superconducting circuits are designed by arranging capacitors, inductors, and Josephson junctions to tailor specific dynamics such as amplifying or frequency converting signals. Another focus of superconducting circuits is to realize highly anharmonic modes, the energy level structure of which resembling that of an atom. Thus, quantum information can be encoded into two specifically addressable energy levels that form a qubit.

To be more quantitative, the mixing capabilities of a system is given by the resonant non-linear terms in its Hamiltonian. For example, the previously mentioned conversion process writes $\hbar g p a b^+$ which indicates that one photon is destroyed in both the pump mode and the 'a' mode via the annihilation operators p and a, respectively, and one photon is created in 'b' mode via the creation operator $b^+$ with a rate g. This is a three-wave mixing Hamiltonian as three operators are used. Since every process is reversible at the Hamiltonian level, the reverse process term is also present, $\hbar g p^+ a^+ b$.

In superconducting circuits, these terms arise from the Josephson junction energy $E_J \cos(\varphi)$, where $E_J$ is the Josephson energy of the junction which can be tuned during fabrication, and $\varphi$ is the phase difference across the junction that is the time integral of its voltage difference. The Josephson junction can be viewed as an inductive element as at first order in $\varphi$ its energy resembles that of an inductor $E_L \varphi^2/2$, where $E_L$ is the inductor energy.

In a circuit that hosts n modes represented by their annihilation operators $a_1, \ldots, a_n$, the phase $\varphi$ can be decomposed as $\varphi=\Sigma_i \varphi_i(a_i+a_i^+)$ where the coefficients $\varphi_i$ relate to how much mode i affects the phase difference across the junction. The larger $\varphi_i$ is, the more mode i is said to participate in the junction. By Taylor expanding $E_J \cos(\varphi)$, only even-wave mixing arise.

As such, a term of the form $\hbar g p a b^+$ cannot appear in the Hamiltonian. However, the energy of the junction is adjustable by placing the junction into loops through which magnetic flux is threaded. This way, the general energy brought by the junction writes $E_J \cos(\varphi+\bar{\varphi}_{ext})$ where $\bar{\varphi}_{ext}$ is associated to the external magnetic flux threading the loops of the circuit. Now, the Taylor development may contain even and odd mixing terms.

The challenge of wave mixing with superconducting circuits is that whereas a single mixing term is usually desired for a given application, the expansion of the junction cosine potential gives rise to a plethora of terms. When parametric pumping is used, adjusting the pump frequency enables to select a few of these terms using the frequency matching condition. Nevertheless, there exist terms for which the frequency matching condition is always verified and that cannot be made non-resonant. These are the Kerr or cross-Kerr terms respectively of the form $a_i^{+2} a_i^2$ and $a_i^+ a_i a_j^+ a_j$ or all the higher even order terms that are built in the same manner. The first effect of these terms is to shift the modes frequencies when they get populated. However, they also have detrimental effects such as limiting the dynamic range of the engineered process or deforming quantum states. Also, when the pump power is increased to boost the non-linear interaction, they may render the system unstable.

Improving the properties of wave mixing with superconducting circuits is an on-going topic of research. For example, Sivak et at., Phys. Rev. Applied 11, 054060 (2019) proposed a new dipole called the SNAIL (Superconducting Nonlinear Asymmetric Inductive eLement) that enables three-wave mixing (and more generally odd-wave mixing) without Kerr terms.

It is an object of the present invention to provide a dipole element for superconducting circuits overcoming the drawbacks of the prior art.

SUMMARY OF THE INVENTION

According to an aspect of the present invention, there is provided an inductive dipole element for a superconducting microwave quantum circuit, the dipole element comprising a DC-SQUID (Superconducting Quantum Interference Device) formed by a pair of Josephson junctions being shunted by an inductance, wherein the Josephson junctions have equal energy, and the Josephson junctions and the inductance are arranged such that each of the junctions forms a loop with the inductance. The loops are asymmetrically threaded with external magnetic static (DC) flux $\varphi_{ext1}$ and $\varphi_{ext2}$, respectively, such that $\varphi_{ext1}-\varphi_{ext2}=\varphi_{ext1}+\varphi_{ext2}=\pi$, leading to $\varphi_{ext1}=\pi$ and $\varphi_{ext2}=0$, hence its name, Asymmetrically Threaded SQUID (ATS). Parametric pumping is enabled by modulating the global flux threading the ATS. This pumping allows even-wave mixing between the modes that participate in the dipole with no Kerr-like terms. These latter terms, which are parasitic for parametric pumping applications, are cancelled thanks to the ATS symmetry.

In one embodiment, the inductance comprises a superconducting wire made of plain or granular superconducting material. Thus, the embodiment provides a dipole element in one alternative configuration.

In another embodiment, the inductance comprises a set of Josephson junctions connected in series with each other. Thus, the embodiment provides a dipole element in another alternative configuration.

In an embodiment, the external magnetic DC flux is applied by superconducting lines in which both a DC and an AC current circulate, $I_1$ to induce $\varphi_{ext1}$ and $I_2$ for $\varphi_{ext2}$, the superconducting lines being adjacent to the superconducting loops.

In another embodiment, the superconducting lines are directly inductively connected to wires of the loops. Thus, the superconducting bias lines do not only share mutual inductance with the loops, but rather share real inductance with the loop wires by being directly connected.

In another embodiment, the lines are arranged such that one input current $I_\Sigma$ biases the total flux in the dipole element, $\varphi_\Sigma=\varphi_{ext,1}+\varphi_{ext,2}$, and another input current $I_\Delta$ biases the differential flux of the dipole element, $\varphi_\Delta=\varphi_{ext,1}-\varphi_{ext,2}$.

In an embodiment, the parametric pumping is delivered by an oscillating magnetic flux generated by an oscillating current $I_\Sigma$. Thus, the embodiment provides a practical way for coupling the pump to the global magnetic flux of the dipole element.

In another embodiment, the parametric pumping capabilities may be improved by modulating also $\varphi_\Delta=\varphi_{ext,1}-\varphi_{ext,2}$ with an appropriate modulation phase and amplitude, chosen to cancel higher order effects.

In an embodiment, one of the junctions is replaced by a DC-SQUID to account for natural asymmetries of the junction energies.

According to another aspect of the present invention, there is provided a superconducting microwave quantum circuit, comprising a dipole element according to embodiments disclosed herein. The dipole element is capacitively shunted to form a resonating electromagnetic mode at frequency $\omega_b$. This non-linear mode, dubbed the buffer, is capacitively coupled to a linear resonator with frequency $\omega_a$ called the storage. When pumped at frequency $\omega_p=2\omega_a-\omega_b$, the ATS mediates a two-to-one photon conversion interaction between the storage and the buffer of the form $\hbar g p a^2 b^+$+ h.c. This interaction is leveraged to stabilise cat states in the storage resonator, eventually forming a stabilised qubit. Thus, the embodiment provides a particular manner of implementing the dipole element.

BRIEF DESCRIPTION OF THE DRAWINGS

Other advantages and features of the invention will become apparent by reference to the following detailed description of illustrative embodiments thereof, and from the accompanying drawings, wherein.

DETAILED DESCRIPTION

It is well understood that the embodiments which will be described hereinafter are in no way limitative. Variants of the invention can be considered comprising only a selection of the characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described can be combined together if there is no objection to this combination from a technical point of view.

In the Figures, the elements that are common to several Figures keep the same reference.

FIGS. 1a to 1e represent several non-linear inductive dipoles using Josephson junctions. The phase difference across the dipole is denoted $\varphi$ and corresponds to the time integral of the voltage.

Figure 1:
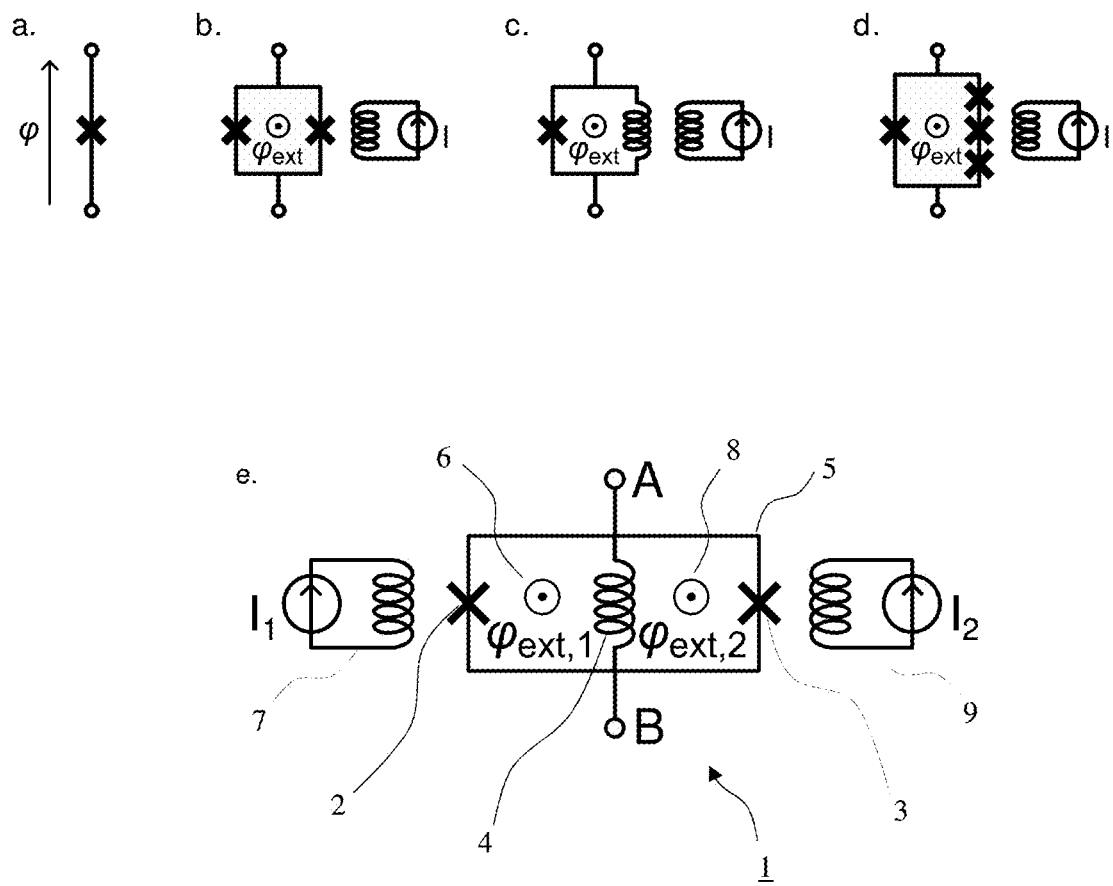
FIG. 1a-FIG. 1d schematically depict examples of inductive dipoles comprising Josephson junctions.
FIG. 1e schematically depicts a dipole element in accordance with an illustrative embodiment of the invention.

FIG. 1a shows a simple junction with energy $E_J \cos(\varphi)$, where $E_J$ is the Josephson junction energy and $\varphi$ is the phase difference across the junction.

FIG. 1b represents a DC-SQUID with energy $2E_J \cos(\varphi_{ext})\cos(\varphi)$ where the external flux $\varphi_{ext}$ is provided by a coil powered by a current source. A DC-SQUID may be seen as a single Josephson junction with tunable energy $E_J \leftrightarrow 2E_J \cos(\varphi_{ext})$.

FIG. 1c corresponds to an RF-SQUID, and FIG. 1d represents a SNAIL element. Both elements require a flux biasing circuit (current source and coil) to thread external flux through the loops.

FIG. 1e is a schematic representation of a configuration of a dipole element according to an embodiment of the present invention.

The dipole element, or Asymmetrically Threaded SQUID (ATS) as represented in FIG. 1e, comprises a pair of Josephson junctions 2, 3 arranged in parallel and forming a loop. According to the represented example, the dipole is symmetric, meaning that the Josephson junctions 2, 3 have identical Josephson energies.

The loop 5 of the dipole element is shunted (electrically coupled in parallel) in its middle with an inductance 4. The inductance 4 thus delimits two loops, each containing a Josephson junction 2, 3. The dipole according to embodiments disclosed herein thus comprises the two loops 6, 8 formed by the Josephson junctions 2, 3 and the inductance 4.

According to alternative embodiments, the inductance 4 may be constituted by a chain of Josephson junctions, by a plain superconducting line or made out of granular aluminium, or by any other inductive device adapted for the implementation with the dipole of the present invention.

The dipole element is biased by a DC magnetic field which threads a flux $\varphi_{ext,1}$ in the first loop 6 and a flux $\varphi_{ext,2}$ in the second loop 8. When the bias is such that $\varphi_{ext,1}=\pi$ and $\varphi_{ext,2}=0$, the dipole has an energy of the form $E_L\varphi^2/2+2E_J \sin \varphi_\Sigma \sin \varphi$ where $\varphi_\Sigma$ is a small deviation of the total flux threading the ATS. When the pump couples to $\varphi_\Sigma$ such that $\varphi_\Sigma=\varphi_p(p+p^+)$, there are only even terms in the expansion of the dipole energy but none is of the Kerr form. Eventually, the desired mixing term can be selected by adjusting the pump frequency. This dipole enables to engineer any even-wave mixing process, one of the wave being the pump. Another advantage of the ATS is that it has an unbounded potential which makes it better suited for parametric pumping.

The unbounded potential provided by the central inductance 4, $E_L\varphi^2/2$, prevents the system from escaping to high energy states when the system is strongly pumped. This property enables the ATS according to embodiments disclosed herein to be used for sensitive parametric pumping tasks, such as stabilizing quantum states of coupled electromagnetic modes to form long-lived qubits.

Thus, the ATS dipole according to embodiments of the present invention circumvents the problems that may arise in the presence of Kerr non-linearity by cancelling these terms by symmetry.

Crucially, the dipole elements and the parametric pumping should preserve the ATS symmetries according to the present invention. In particular, a small asymmetry in the energy of the junctions that arises from unavoidable fabrication imprecisions, leads to parasitic Kerr nonlinearities.

In order to compensate for this asymmetry, at least one of the junctions 2, 3 can be made flux tunable by being itself replaced by a SQUID.

In an embodiment, two neighbouring superconducting lines represented by coils 7, 9 enable to flux bias the circuit. When currents $I_1$ and $I_2$ flow through these lines, external fluxes $\varphi_{ext,1}$ and $\varphi_{ext,2}$ thread the two loops of the ATS respectively. The current sources have both, a DC component to set the working point of the ATS and an AC component at the pump frequency to make the desired mixing process resonant. The symmetry of the modulation is achieved by controlling the relative amplitude and phase of the two AC components of the currents $I_1$ and $I_2$. Considering the energy of the dipole written in the previous paragraph, the ideal modulation only addresses the total flux $\varphi_\Sigma=\varphi_{ext,1}+\varphi_{ext,2}$ of the ATS. In practice, some corrections should be brought by modulating also the differential flux $\varphi_\Delta=\varphi_{ext,1}-\varphi_{ext,2}$. These corrections are required to compensate for the direct drive of the dipole by the pump tone.

In an alternative embodiment, the superconducting bias lines share an actual inductance with the loop instead of a mutual inductance in the standard mutual inductance equivalent circuit.

Figure 2:
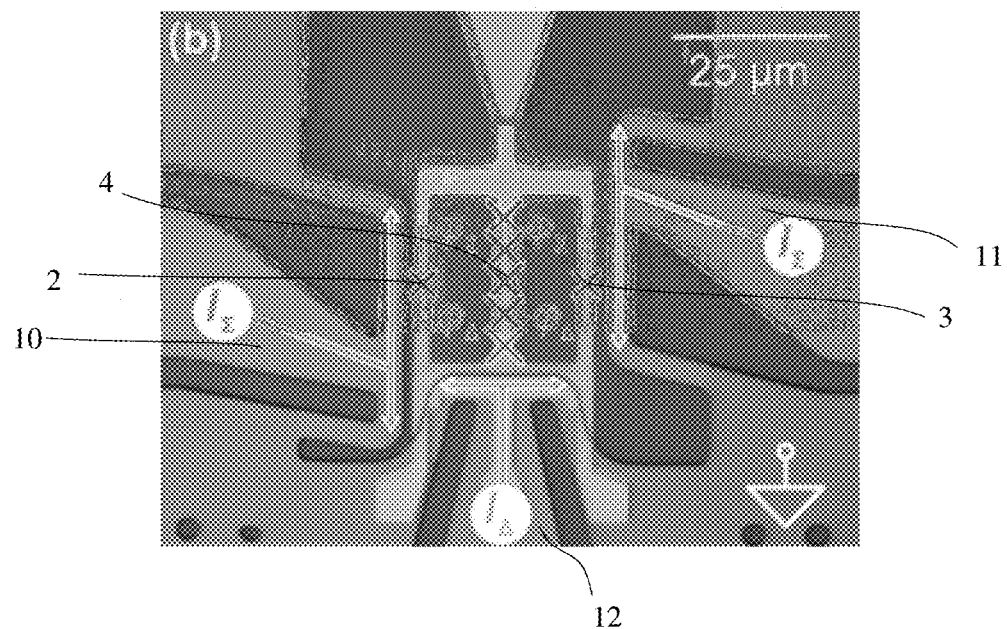
FIG. 2 shows an optical image of an asymmetrically threaded DC-SQUID in accordance with an illustrative embodiment of the invention.

In another embodiment and for practicality, the biasing lines are arranged such that the current sources $I_\Sigma$ and $I_\Delta$ directly address the total flux $\varphi_\Sigma$ and the differential flux $\varphi_\Delta$ (see FIG. 2). The superconducting lines that are coupled to the total flux, are used to convey a microwave pump to the ATS in order to create the oscillating total magnetic flux that acts as a pumping parameter (contrary to $\varphi_\Delta$ which is only required for corrections).

According to this embodiment, the symmetry of the modulation is achieved by having an on-chip hybrid (equally split transmission line) that allows the pump to only address $\varphi_\Sigma$.

FIG. 2 shows an optical image of an asymmetrically threaded DC-SQUID in accordance with an illustrative embodiment of the invention. The electromagnetic dipole is fabricated on-chip and arranged within a superconducting circuit (partially shown). In the embodiment of FIG. 2, the shunt inductance 4 separating the two loops each containing a Josephson junction 2, 3 is formed of a chain or array of 5 Josephson junctions (represented by the 5 crosses centred between the pair of identical Josephson junctions 2, 3 forming the SQUID). The left and right flux lines 10, 11 are connected to the same input through an on-chip hybrid (not represented). The lines carry the microwave frequency pump and a DC current $I_\Sigma$, which thread both loops with a total flux $\varphi_\Sigma$. The flux line 12 at the bottom of the image carries current $I_\Delta$ and threads each loop with flux $\pm\varphi_\Delta$. Combining these two controls, the ATS is biased at the π/0 asymmetric DC working point, meaning that $\varphi_{ext1}-\varphi_{ext2}=\varphi_{ext1}+\varphi_{ext2}=\pi$, with $\varphi_{ext1,2}$ the external flux threading the two loops, respectively. The ATS is operated by modulating the flux $\varphi_\Sigma$ with an oscillating magnetic flux at frequency $\omega_p$.

Figure 3:
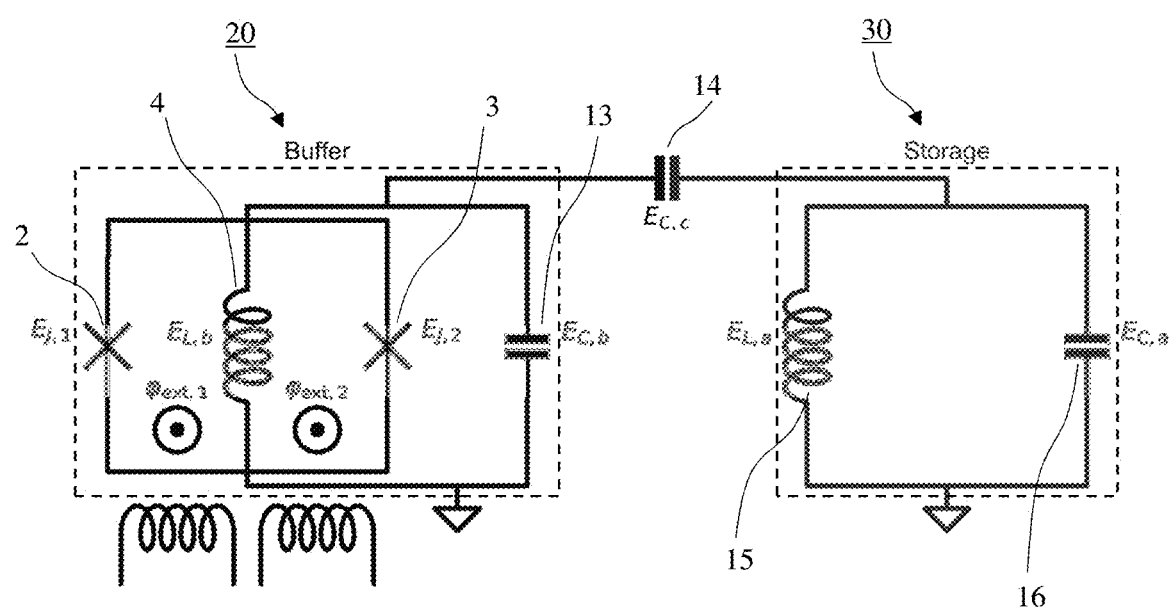
FIG. 3 depicts a circuit diagram of an ATS dipole in a practical implementation in accordance with an illustrative embodiment of the invention.

An example configuration of a superconducting quantum circuit implementing the ATS according to embodiments disclosed herein is represented in FIG. 3. The ATS may be implemented in a circuit to realize a four-wave mixing interaction, one of the waves being a pump tone, the frequency of which being chosen to make the interaction resonant. In particular, the ATS may be implemented for engineering a two-to-one photon exchange interaction between two microwave resonators.

With reference to FIG. 3, the ATS dipole is shunted with a capacitive device 13, thus forming a resonant mode 20. This nonlinear resonator 20 dubbed the buffer is capacitively coupled 14 to a linear resonator 30 called the storage mode, which is modelled by an LC-circuit (inductance 15, capacitor 16).

The ATS is pumped at a frequency $\omega_p=2\omega_a-\omega_b$, where $\omega_{a,b}$ are the frequencies of the storage resonator 30 and the buffer resonator 20, respectively. This parametric pumping mediates a two-to-one photon exchange interaction between the two modes. The storage and buffer modes resonate in the GHz range.

Such an exchange interaction is of great importance in applications tending towards quantum computing and quantum error correction. For example, the interaction may be used for the stabilization of a new type of qubits, called cat-qubits. Cat-qubits are promising candidates for hardware efficient quantum error correction, allowing for the protection and stabilization of quantum information.

The dipole according to embodiments disclosed herein may also be implemented for microwave photo-detection applications or for the realization of logical operations between qubits.

While this invention has been described in conjunction with a number of embodiments, it is evident that many alternatives, modifications, and variations would be or are apparent to those of ordinary skill in the applicable arts. Accordingly, it is intended to embrace all such alternatives, modifications, equivalents, and variations that are within the spirit and scope of this invention.

The invention claimed is:

1. An inductive dipole element for a superconducting microwave quantum circuit, the dipole element comprising:
   a DC-SQUID formed by first and second Josephson junctions shunted by an inductance,
   wherein the first and second Josephson junctions have equal energy,
   wherein the first and second Josephson junctions and the inductance are arranged such that each of the junctions respectively forms first and second superconducting loops with the inductance,
   the first and second superconducting loops being asymmetrically threaded with independently controlled external magnetic DC fluxes $\varphi_{ext1}$ and $\varphi_{ext2}$, respectively, such that $\varphi_{ext1}=\pi$ and $\varphi_{ext2}=0$, and
   wherein parametric pumping is enabled by modulating a total flux $\varphi_\Sigma=\varphi_{ext,1}+\varphi_{ext,2}$ threading the dipole element, thereby allowing even-wave mixing between modes that participate in the dipole element with no Kerr-like interactions.

2. The dipole element according to claim 1, wherein the parametric pumping is further enabled by also modulating a differential flux $\varphi_\Delta=\varphi_{ext,1}-\varphi_{ext,2}$ with an appropriate modulation phase and amplitude.

3. The dipole element according to claim 1, wherein the external magnetic DC fluxes $\varphi_{ext,1}$ and $\varphi_{ext,2}$ are applied via superconducting lines that are adjacent to the superconducting loops, in which both a DC and an AC current circulate.

4. The dipole element according to claim 3, wherein the superconducting lines are directly connected to wires of the loops.

5. The dipole element according to claim 3,
   wherein the superconducting lines are arranged such that one input current $I_\Sigma$ biases the total flux in the dipole element, $\varphi_\Sigma=\varphi_{ext,1}+\varphi_{ext,2}$, and another input current $I_\Delta$ biases the differential flux of the dipole element, $\varphi_\Delta=\varphi_{ext,1}-\varphi_{ext2}$, and
   wherein the parametric pumping is delivered by the oscillating magnetic flux generated by the oscillating component of $I_\Sigma$.

6. The dipole element according to claim 1, wherein the inductance comprises a superconducting wire made of plain or granular superconducting material.

7. The dipole element according to claim 1, wherein the inductance comprises a chain of Josephson junctions connected in series with each other.

8. An inductive dipole element for a superconducting microwave quantum circuit, the inductive dipole element comprising:
   a first DC-SQUID, formed by a Josephson junction and a second DC-SQUID, the Josephson junction and the second DC-SQUID arranged in parallel so as to form a loop that is shunted by an inductance,
   wherein the Josephson junction and the second DC-SQUID have equal energy,
   wherein the Josephson junction, the second DC-SQUID, and the inductance are arranged such that the Josephson junction and the second DC-SQUID respectively form with the inductance a first superconducting loop and a second superconducting loop,
   the first and second superconducting loops being asymmetrically threaded with external magnetic DC fluxes $\varphi_{ext1}$ and $\varphi_{ext2}$, respectively, such that $\varphi_{ext1}=\pi$ and $\varphi_{ext2}=0$, and
   wherein parametric pumping is enabled by modulating a total flux $\varphi_\Sigma=\varphi_{ext1}+\varphi_{ext2}$ threading the inductive dipole element, thereby allowing even-wave mixing between modes that participate in the inductive dipole element with no Kerr-like interactions.

9. A superconducting microwave quantum circuit, comprising a dipole element according to claim 1, the dipole element being capacitively shunted to form a non-linear resonator coupled to a linear resonator, wherein the non-linear interaction provided by the parametrically pumped dipole element causes a two-to-one photon exchange between the linear resonator and the non-linear resonator.

* * * * *